US008476099B2

(12) United States Patent
Cooney, III et al.

(10) Patent No.: US 8,476,099 B2
(45) Date of Patent: Jul. 2, 2013

(54) METHODS FOR IMPROVED ADHESION OF PROTECTIVE LAYERS OF IMAGER MICROLENS STRUCTURES BY FORMING AN INTERFACIAL REGION

(75) Inventors: Edward C. Cooney, III, Jericho, VT (US); Jeffrey P. Gambino, Westford, VT (US); Robert K. Leidy, Burlington, VT (US); Charles F. Musante, South Burlington, VT (US); John G. Twombly, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 12/841,750

(22) Filed: Jul. 22, 2010

(65) Prior Publication Data

US 2012/0018832 A1 Jan. 26, 2012

(51) Int. Cl.
*H01L 21/473* (2006.01)
*H01L 31/18* (2006.01)

(52) U.S. Cl.
USPC .............................................. 438/71; 438/788

(58) Field of Classification Search
USPC ........................................................... 438/71
See application file for complete search history.

(56) References Cited

U.S. PATENT DOCUMENTS

| | | | |
|---|---|---|---|
| 5,527,629 A | 6/1996 | Gastiger et al. | |
| 6,319,849 B1 | 11/2001 | Oda et al. | |
| 8,130,314 B2 * | 3/2012 | Kawasaki | 348/374 |
| 2006/0261427 A1 | 11/2006 | Dillon et al. | |
| 2007/0010041 A1 | 1/2007 | Kang et al. | |
| 2008/0108170 A1 | 5/2008 | Adkisson et al. | |
| 2008/0150056 A1 | 6/2008 | Kim | |
| 2008/0237671 A1 | 10/2008 | Kim | |
| 2008/0286910 A1 | 11/2008 | Yamazaki et al. | |
| 2009/0029562 A1 | 1/2009 | Okada et al. | |
| 2009/0095891 A1 | 4/2009 | Park | |
| 2009/0203227 A1 | 8/2009 | Hasebe et al. | |
| 2010/0255218 A1 | 10/2010 | Oka et al. | |

FOREIGN PATENT DOCUMENTS

| | | | |
|---|---|---|---|
| JP | 55130841 A | | 10/1980 |
| JP | 63316333 A | | 12/1988 |
| JP | 2009004741 A | | 1/2009 |
| WO | WO-00/29907 A1 | | 5/2000 |
| WO | WO-2007/072624 A1 | | 6/2007 |

OTHER PUBLICATIONS

International Search Report and Written Opinion dated Nov. 23, 2011 in PCT Application No. PCT/EP2011/061430.

\* cited by examiner

*Primary Examiner* — Stephen W Smoot
(74) *Attorney, Agent, or Firm* — Anthony Canale; Roberts Mlotkowski Safran & Cole, P.C.

(57) ABSTRACT

Methods, structures, and design structures for improved adhesion of protective layers of imager microlens structures are disclosed. A method of fabricating a semiconductor structure includes forming an interfacial region between a microlens and a protective oxide layer. The interfacial region has a lower concentration of oxygen than the protective oxide layer.

19 Claims, 9 Drawing Sheets

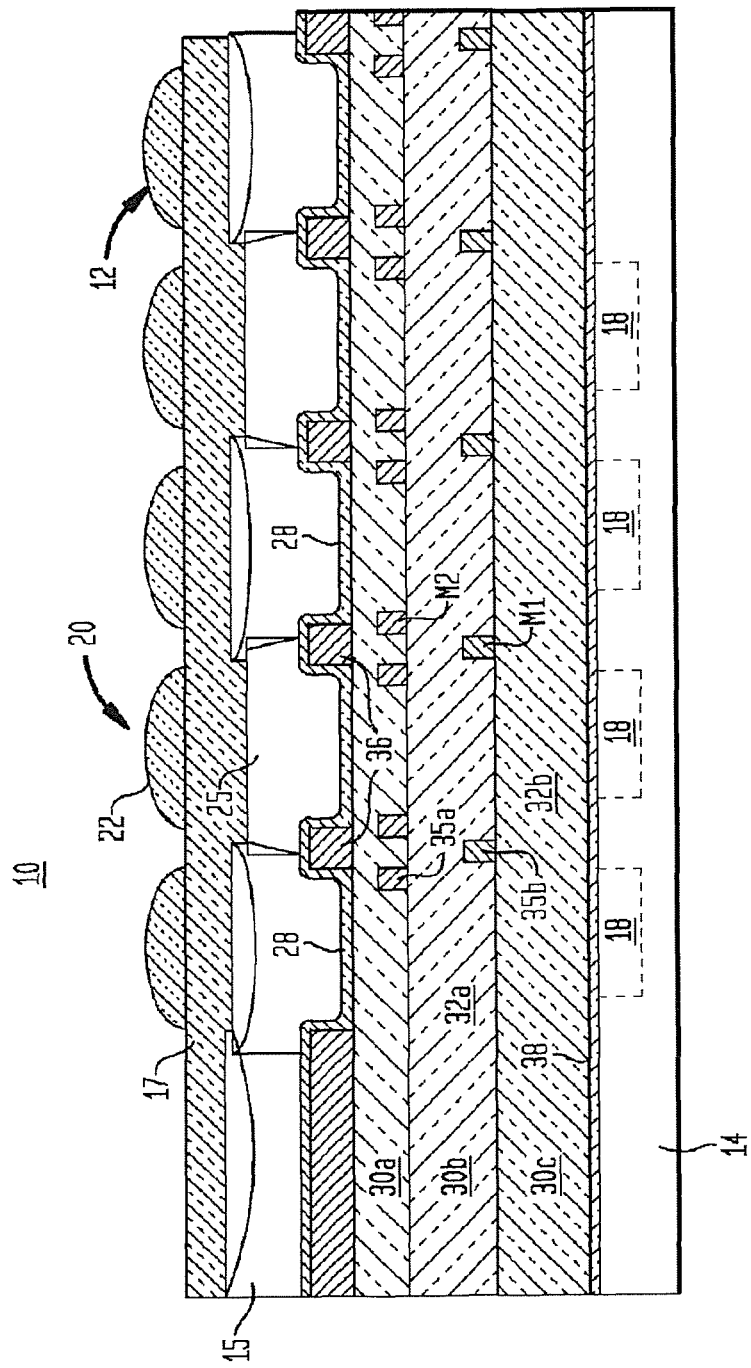
FIG. 1
Conventional

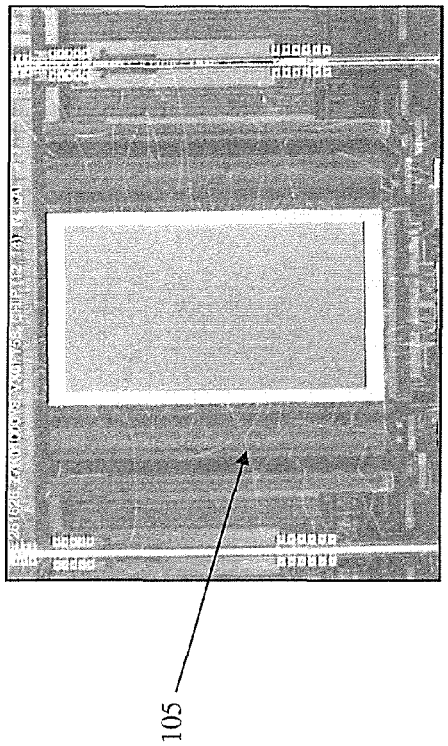
*FIG. 2A*
Conventional
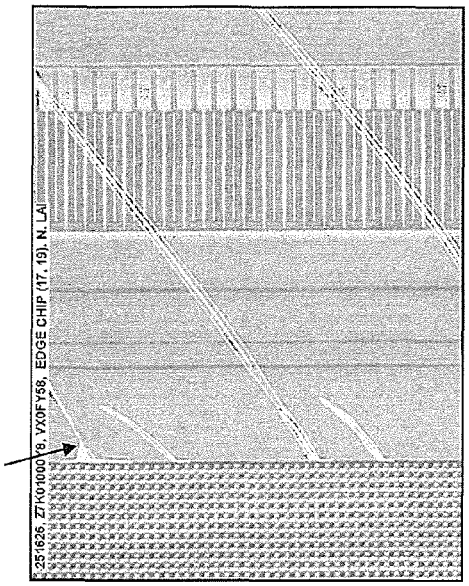
*FIG. 2B*
Conventional
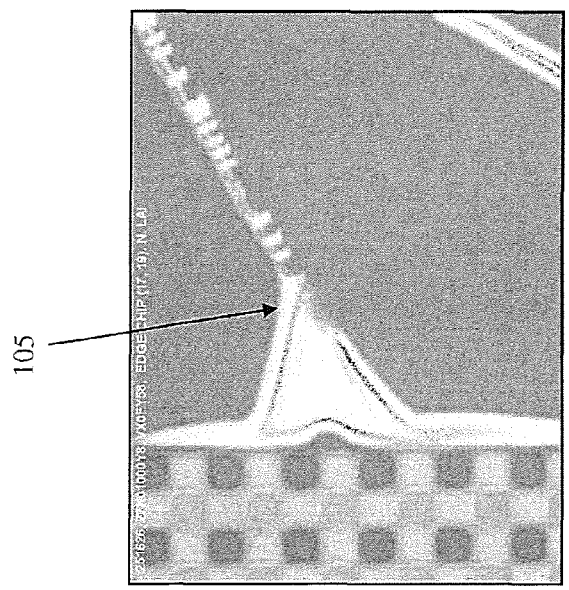
*FIG. 2C*
Conventional

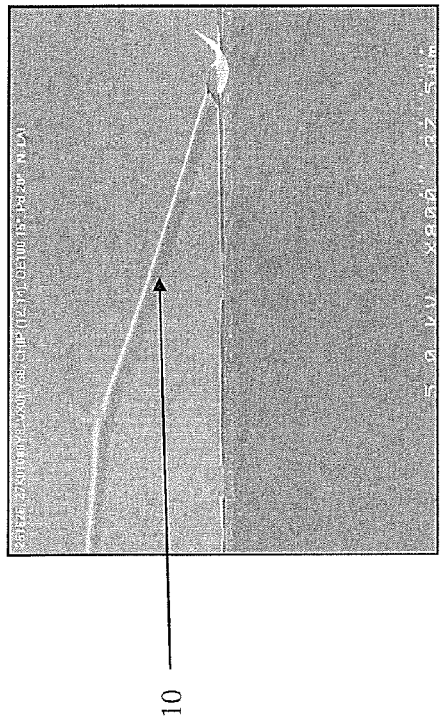
FIG. 3A
Conventional
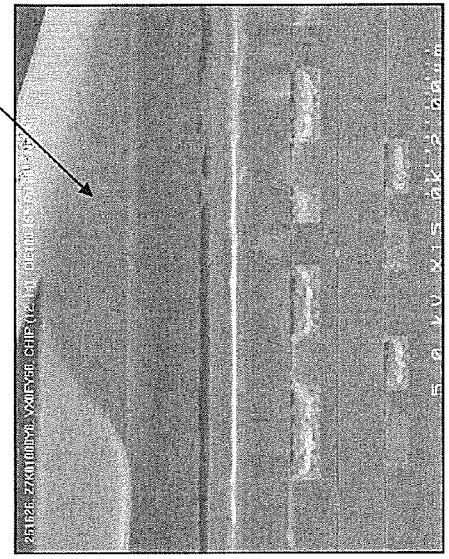
FIG. 3B
Conventional
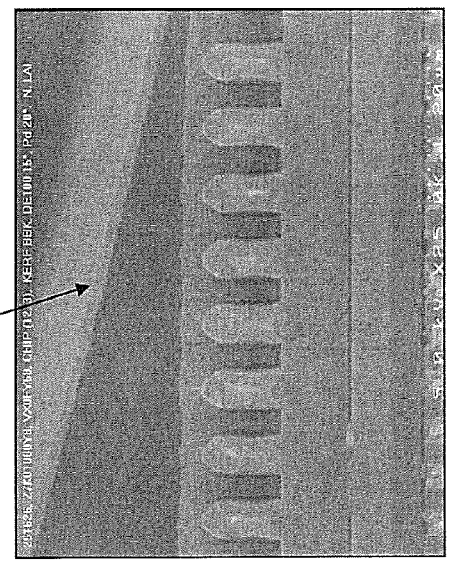
FIG. 3C
Conventional

METHODS FOR IMPROVED ADHESION OF PROTECTIVE LAYERS OF IMAGER MICROLENS STRUCTURES BY FORMING AN INTERFACIAL REGION

FIELD OF THE INVENTION

The invention relates to a semiconductor structures and methods of manufacture and, more particularly, to methods, structures, and design structures for improved adhesion of protective layers of imager microlens structures.

BACKGROUND

CMOS image sensors are beginning to replace conventional CCD sensors for applications requiring image pickup such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

FIG. 1 depicts a CMOS image sensor pixel array 10. As shown, the array comprises a plurality of microlenses 12, each having a hemisphere shape, arranged on a smooth planarization layer 17, e.g., a spin on polymer, that is formed on top of a color filter array 15 enabling formation of the microlens array. The color filter array 15 includes individual red, green and blue filter elements 25 (primary color filters) or alternately, cyan, magenta and yellow filter elements (complementary color filter). Each microlens 22 of the microlens array 12 is aligned with a corresponding color filter element 25 and comprises an upper light receiving portion of a pixel 20. The pixel 20 includes a cell portion fabricated upon a semiconductor substrate 14 portion including a stack of comprising one or more interlevel dielectric layers 30a-30c incorporating metallization interconnect levels M1, M2 Aluminum (Al) wire layers 35a, 35b. Interlevel dielectric materials may comprise a polymer or SiO$_2$, for example. As Al metallization interconnect layers 35a, 35b do not require passivation, no respective barrier layers are shown.

As further shown in FIG. 1, each pixel cell 20 having the Al metallizations 35a, 35b further includes a final Aluminum metal level 36 that enables wire bonding to the M1 and M2 metallizations between each pixel 20, and a final passivation layer 28 is formed above the wire bonding level 36. This final passivation layer 28 may comprise SiN, SiO$_2$, or combinations of these. Although not shown in detail, each pixel 20 includes a photoelectric converting device including a light sensitive element such as a photodiode 18 that performs photoelectric conversion and a CMOS transistor (not shown) that performs charge amplification and switching. Each of the pixels 20 generates a signal charge corresponding to the intensity of light received by each pixel and is converted to a signal current by the photoelectric conversion (photodiode) element 18 formed on semiconductor substrate 14. A further barrier or capping layer, e.g., a nitride such as SiN layer 38, is formed above unsilicided diffusion regions formed at the Si substrate 14 surface.

A protective film, such as a low temperature oxide (LTO), may be formed on microlenses to protect the microlenses during subsequent processing steps including sawing (e.g., cutting dicing, etc.) individual chips from a wafer. By changing the top surface of the structure from the hydrophobic microlenses to hydrophilic oxide, dicing dust is reduced since the surface becomes easier to rinse. However, the protective LTO layer suffers from cracking and/or delamination (e.g., peeling away from the microlens) during dicing, which disadvantageously reduces package yield. For example, FIGS. 2A-2C depict various magnifications of cracks 105 in an LTO layer. Also, FIGS. 3A-3C depict various magnifications of peeling (e.g., delamination) 110 of an LTO layer.

Accordingly, there exists a need in the art to overcome the deficiencies and limitations described hereinabove.

SUMMARY

In a first aspect of the invention, there is a method of fabricating a semiconductor structure includes forming an interfacial region between a microlens and a protective oxide layer. The interfacial region has a lower concentration of oxygen than the protective oxide layer.

In another aspect of the invention, there is a pixel sensor cell structure including: an organic microlens element formed on a substrate; an inorganic protective layer formed over the microlens element; and an interfacial region located between the organic microlens element and the inorganic protective layer. The interfacial region has a lower oxygen concentration than the inorganic protective layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a pixel sensor cell structure, which comprises structures in accordance with aspects of the present invention. For example, the pixel sensor cell structure may include: an organic microlens element formed on a substrate; an inorganic protective layer formed over the microlens element; and an interfacial region located between the organic microlens element and the inorganic protective layer, wherein the interfacial region has a lower oxygen concentration than the inorganic protective layer. In still further embodiments, a method in a computer-aided design system is provided for generating a functional design model of the pixel sensor cell structure. The method comprises generating a functional representation of the structural elements of the pixel sensor cell structure.

In accordance with another aspect of the invention, there is a method of forming a semiconductor structure. The method includes forming an organic layer on a substrate and forming an inorganic layer on the organic layer. The forming the inorganic layer comprises forming an interfacial region between the organic layer and the inorganic layer. The interfacial region has a lower concentration of oxygen than the inorganic layer. The interfacial region increases adhesion between the organic layer and the inorganic layer compared to an adhesion level of the organic layer being in direct contact with the inorganic layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1 depicts a CMOS image sensor pixel array according to the prior art;

FIGS. 2A-2C depict various magnifications of cracks in an LTO layer;

FIGS. 3A-3C depict various magnifications of peeling (e.g., delamination) of an LTO layer;

DETAILED DESCRIPTION

The invention relates to a semiconductor structures and methods of manufacture and, more particularly, to methods, structures, and design structures for improved adhesion of protective layers of imager microlens structures. In accordance with aspects of the invention, a method of forming a protective oxide layer on a microlens includes forming a silicon-rich interfacial region between the oxide and the microlens. The silicon-rich region improves adhesion of the oxide to the microlens, which reduces cracking and delaminating of the oxide, which improves yield.

In embodiments, a method of forming the protective oxide layer includes creating an environment that promotes silicon-carbon bonds rather than silicon-oxygen bonds, which results in the silicon-rich interfacial region that is substantially devoid of oxygen or which has an oxygen concentration substantially less than that of the protective oxide layer. In particular embodiments, a method includes introducing an inorganic silicon-based precursor gas into a deposition chamber for a predetermined time prior to initiating deposition of the protective oxide layer. In this manner, implementations of the invention may be used in the formation of a pixel sensor cell, e.g., a CMOS sensor, to improve the adhesion of the protective oxide layer to the microlens structure.

Figure 4:
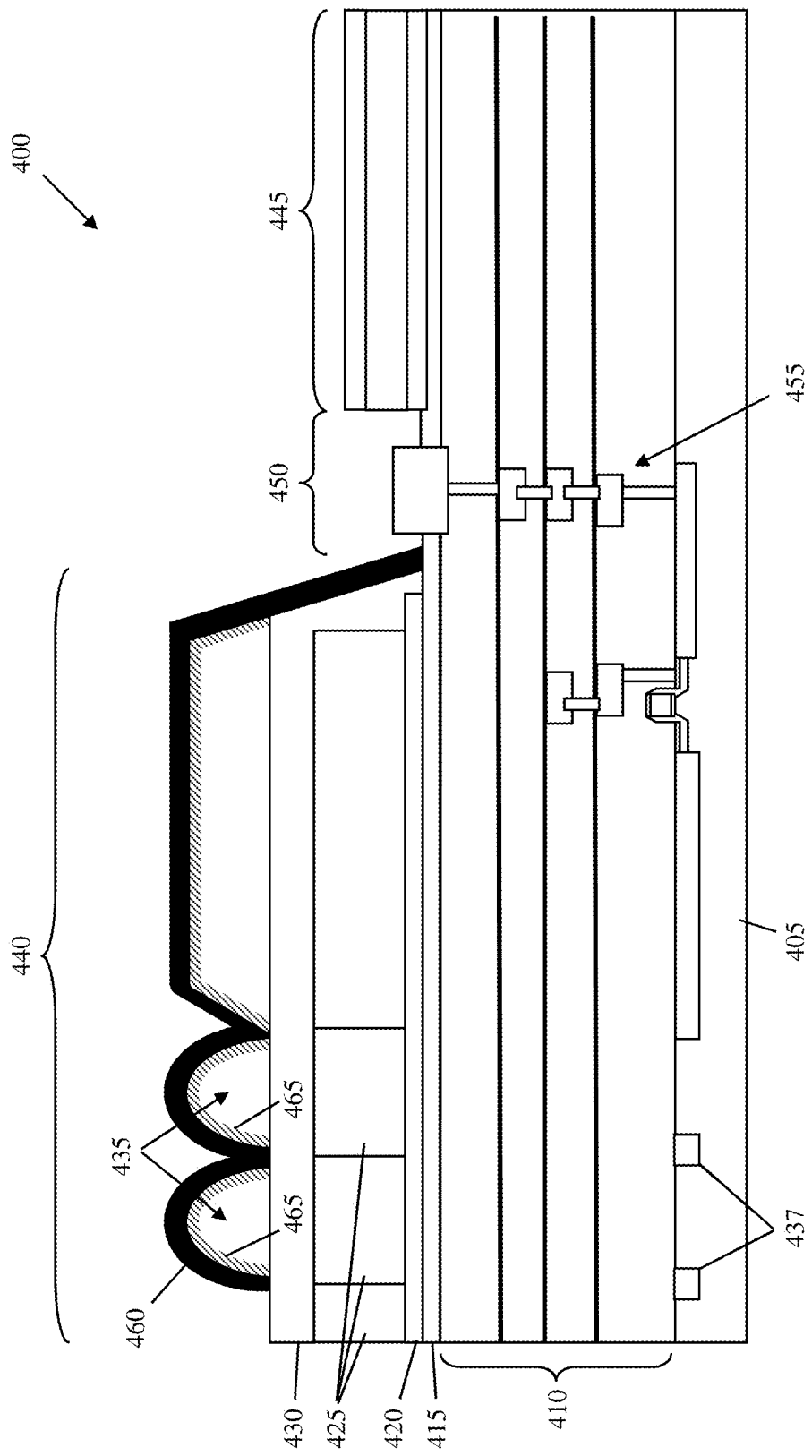
FIG. 4 shows a semiconductor structure and respective processes in accordance with aspects of the invention.

FIG. 4 shows a semiconductor wafer 400 and respective processes in accordance with aspects of the invention. In embodiments, the structure includes a substrate 405, a plurality of interlevel dielectric layers 410 formed on the substrate 405, and one or more passivation layers, such as, for example, an oxide layer 415 and a nitride layer 420 formed on the interlevel dielectric layers 410. The wafer 400 also includes a plurality of individual color filter elements 425, a planarization layer 430, a plurality of microlenses 435, and a plurality of photoelectric conversion (photodiode) elements 437 formed in the substrate. The structures of the wafer 400 described thusfar may be formed with conventional materials and using conventional semiconductor fabrication techniques, such as, for example, lithographic etching and deposition processes, or other suitable materials and techniques used in the fabrication of a CMOS image sensor pixel array. For example, the etching may include reactive ion etching (RIE), and the deposition processes may include chemical vapor deposition (CVD) or derivatives of CVD.

In embodiments, the wafer 400 may include a chip area 440, a kerf area 445, and a crack-stop area 450. The wafer 400 may include a plurality of chip areas 440, each of which may be used as a CMOS image sensor pixel array (i.e., pixel sensor cell). Each chip area 440 may be bounded on its perimeter by corresponding crack-stop areas 450 and kerf areas 445. The kerf area 445 corresponds to an area where the wafer 400 is cut (e.g., sawn, diced, etc.) in order to divide the wafer 400 into plural individual chips, and the crack-stop area 450 is a metallurgical barrier that prevents cracks from propagating from the kerf area 445 to the chip area 440 during cutting. In embodiments, the crack-stop area 450 may comprise a series of metal interconnects and vias (collectively referred to with number 455) arranged in a substantially vertical manner through the layers of the wafer 400 between the kerf area 445 and the chip area 440.

Still referring to FIG. 4, a protective oxide layer 460 is formed over the microlens elements 435. In methods according to aspects of the invention, the formation of the protective oxide layer 460 is carried out in a controlled and predetermined manner (as described below) such that an interfacial region 465 is formed between the microlens elements 435 and the protective oxide layer 460. In embodiments, the interfacial region 465 is a silicon rich region of material that improves adhesion of the protective oxide layer 460 to the microlens elements 435.

In embodiments, the microlens elements 435 are composed of an organic material, such as a carbon containing resist material. An exemplary microlens material is a photoresist such as MFR-401, manufactured by Japan Synthetic Rubber Company (JSR), although the invention is not limited to this material, and any suitable organic material may be used for the microlens elements 435. In embodiments, the microlens elements 435 may be formed using conventional reflow techniques that result in each microlens element 435 having a hemispherical, dome, or convex shape with a radius of 5 µm or less.

In further embodiments, the protective oxide layer 460 comprises an inorganic oxide. For example, the protective oxide layer 460 may comprise a low temperature oxide (LTO), such as silicon oxide, formed using plasma enhanced chemical vapor deposition (PECVD). In embodiments, the silicon oxide may be composed primarily of silicon dioxide. The protective oxide layer 460 may have a thickness of about 80 nm; however, the invention is not limited to this thickness and any suitable thickness may be used within the scope of the invention.

In accordance with aspects of the invention, the interfacial region 465 is formed between the organic material of the microlens elements 435 and the protective oxide layer 460 at the initial stages of the deposition process of the protective oxide layer 460, as described in greater detail herein. In embodiments, the interfacial region 465 is composed of a material that has a substantially lower oxygen concentration than the material of the protective oxide layer 460. For example, when the protective oxide layer is composed primarily of silicon oxide, the interfacial region 465 may be composed of silicon, silicon carbide, silicon nitride, or silicon oxynitride, all of which have a substantially lower oxygen concentration than silicon oxide. In particular embodiments, the interfacial region 465 is a gradiated layer having a thickness within a range of about 1 nm to about 30 nm, preferably of about 10 nm, although the invention is not limited to any particular thickness and any suitable thickness of the interfacial region 465 may be used within the scope of the invention.

In embodiments, the interfacial region 465 and the protective oxide layer 460 are formed in a same PECVD process.

More specifically, the interfacial region 465 and the protective oxide layer 460 may be formed by flowing oxidizer gas and inorganic precursor gas in a process chamber containing the wafer 400 to create an environment in the process chamber prior to application of radio frequency (RF) power, which environment reduces the propensity for silicon-to-oxygen bonds when the RF power is first applied. For example, the environment may be formed such that, when the RF power is initially applied, the stoichiometry of the system results in silicon-to-carbon bonds at the surface of the microlens elements 435 rather than silicon-to-oxygen bonds at this surface. The exposed surface of the microlens elements 435 provides a carbon source for the initial formation of the silicon-to-carbon bonds immediately upon application of the RF power and in the silicon rich environment provided by flowing the silane for a predetermined amount of time. As the deposition process continues and the newly formed interfacial layer 465 covers the microlens elements 435, the carbon source is removed and silicon-oxygen bonding becomes the dominant reaction. In this way, the protective oxide layer 460 is formed.

In embodiments of the invention, the PECVD process is carried out in a process chamber having a resistively heated platen in which RF power is supplied across gas dispersion heads and the platen. A wafer, such as wafer 400, enters the process chamber and is placed on the platen. Nitrogen gas ($N_2$) is flowing at about 2000 sccm and nitrous oxide gas ($N_2O$) is flowing at about 12000 sccm in the process chamber during the wafer transfer. Silane ($SiH_4$) is flowed into the process chamber at a flowrate of about 80 sccm for a predetermined time period prior to applying RF power. After flowing the silane for the predetermined time period, the RF power of about 500 watts is applied, with all gases still flowing, for about six seconds. The six seconds is the station deposition time for the first of six deposition stations. After this first deposition station, the wafer is moved to an adjacent station within the reactor and the process repeats. Wafers are moved out of the reactor after the sixth such deposition with the interfacial region 465 formed on the microlens elements 435 and the protective oxide layer 460 formed on the interfacial region 465. The above-noted PECVD process is merely illustrative and is not meant to limit the instant invention; rather, any suitable process parameters may be used within the scope of the invention.

In accordance with aspects of the invention, the amount of time for flowing the silane prior to applying the RF power is greater than about 2.0 seconds, and preferably between about 2.0 seconds and about 5.0 seconds. Flowing the silane for this predetermined amount of time prior to RF power provides an adequate combination of gases in the environment of the process chamber for promoting the silicon-rich interfacial region 465 upon the application of the RF power. On the other hand, flowing the silane for less than this amount of time, such as, for example, flowing the silane for only about 0.5 seconds prior to the RF power, does not provide the desired environment in the process chamber. Stated differently, when the silane is flowed for only about 0.5 seconds, silicon oxide is formed on the surface of the microlens elements 435 immediately upon application of the RF power, such that the silicon-rich interfacial region 465 is not formed.

Figure 5:
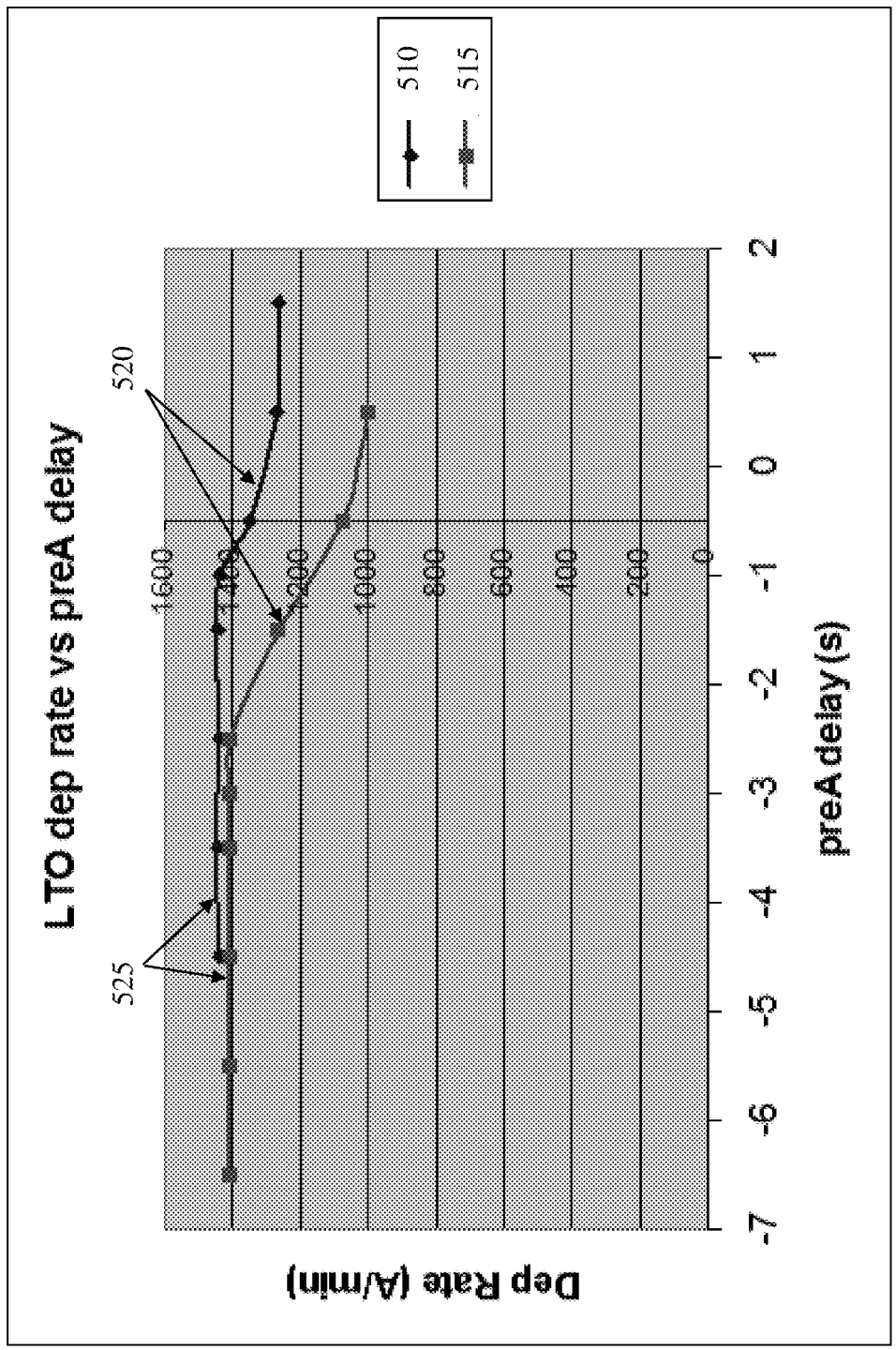
FIG. 5 shows a plot of deposition rate versus delay in accordance with aspects of the invention.

It has been found, quite unexpectedly, that the deposition rate of the protective oxide layer 460 can be affected by the amount of time in which the inorganic precursor (e.g., silane) is flowed prior to the application of RF power in the PECVD process. FIG. 5 shows a graph containing two plots 510 and 515 of deposition rate of the protective oxide layer 460 (on the y axis) versus the amount of time in which the inorganic precursor (e.g., silane) is flowed prior to the application of RF power (on the x axis). In FIG. 5, the amount of time of inorganic precursor gas flow prior to RF power is referred to as "preA delay" and is expressed as a negative number, with zero being the point in time when the RF power is applied. So, for example, a preA delay of −3 equates to flowing the silane gas for 3 seconds prior to the RF power being applied.

Still referring to FIG. 5, the two plots 510 and 515 correspond to PECVD processes carried out using different process equipment. Each plot 510, 515 exhibits a sloped region 520 where deposition rate varies greatly with preA delay, and a plateau region 525 where deposition rate is substantially constant. Operating in the plateau region 525 provides better control of the oxide film thickness that is being deposited due to the substantially constant deposition rate, whereas operating in the sloped region 520 provides less control of the oxide deposition due to the variability of deposition rate.

A condition to be avoided is flowing the inorganic precursor (e.g., silane) for too long a time period prior to applying the RF power. This may lead to a gas phase reaction that results in silicon particles forming in the chamber prior to RF power, which is referred to as powdering the tool. However, by flowing the inorganic precursor for the predetermined time period described herein, e.g., about 2.0 seconds to about 5.0 seconds prior to RF power, implementations of the invention provide a silicon rich environment in the process chamber that forms the interfacial region 465 while avoiding powdering the tool.

Figure 6:
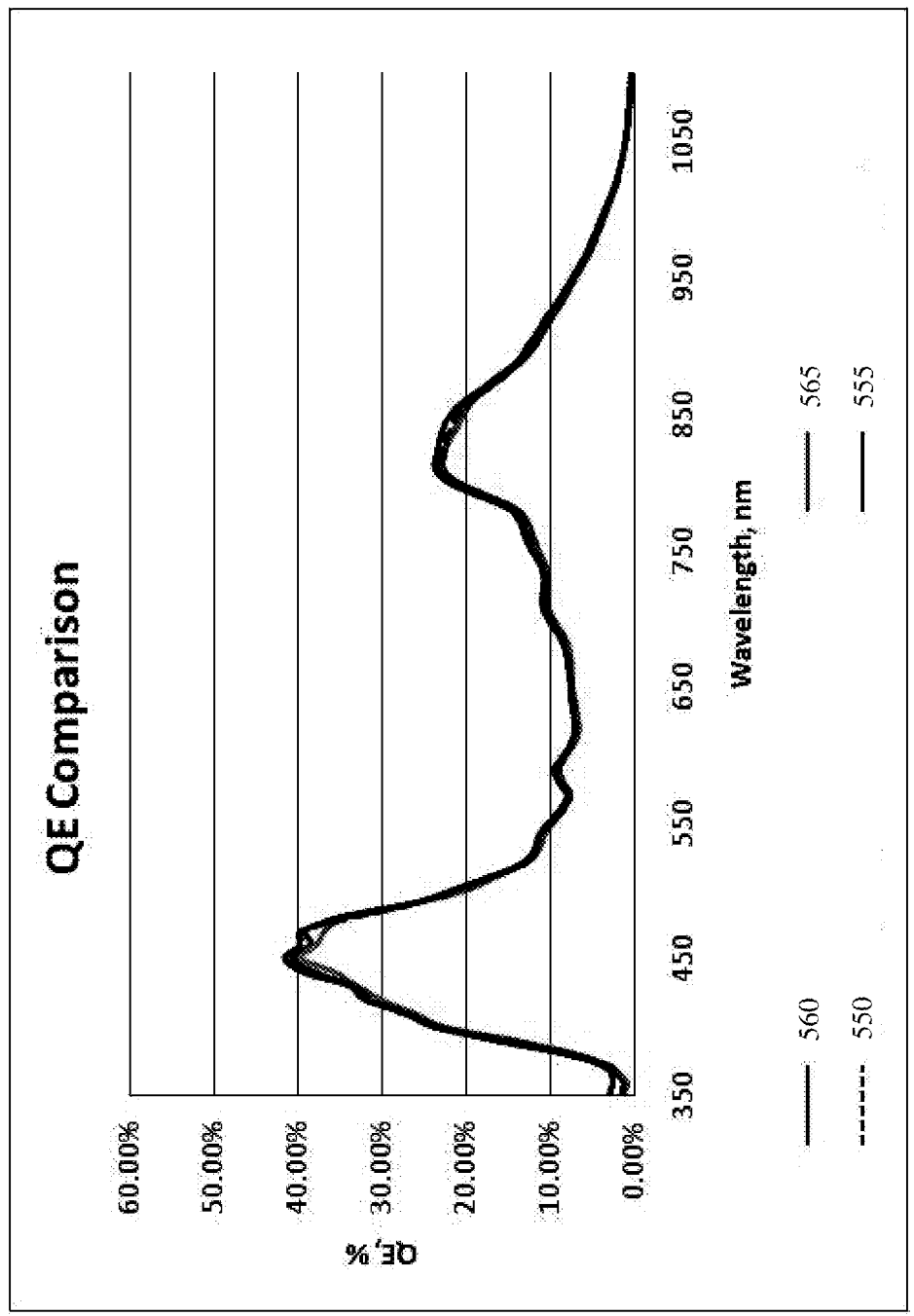
FIG. 6 shows a plot of quantum efficiencies versus wavelength in accordance with aspects of the invention.

Also unexpectedly, the formation of the interfacial region 465 does not appreciably impact the optical characteristics of the sensor device. For example, the interfacial region 465 does not cause any appreciable amount of optical loss due to reflection and/or absorption. FIG. 6 shows a graph of quantum efficiency (QE) versus wavelength for four structures. The first two of the structures, corresponding to plots 550 and 555, were formed using a PECVD process as described above flowing silane for about 2.5 seconds prior to applying RF power, which process formed an interfacial region 465 in accordance with aspects of the invention. Additionally, the other two of the structures, corresponding to plots 560 and 565, were formed using a PECVD process as described above flowing silane for about 0.5 seconds prior to applying RF power which did not form an interfacial region 465. As depicted in FIG. 6, the QE is virtually identical for the structures having the interfacial region 465 as for the structures without the interfacial region 465.

Figure 7A:
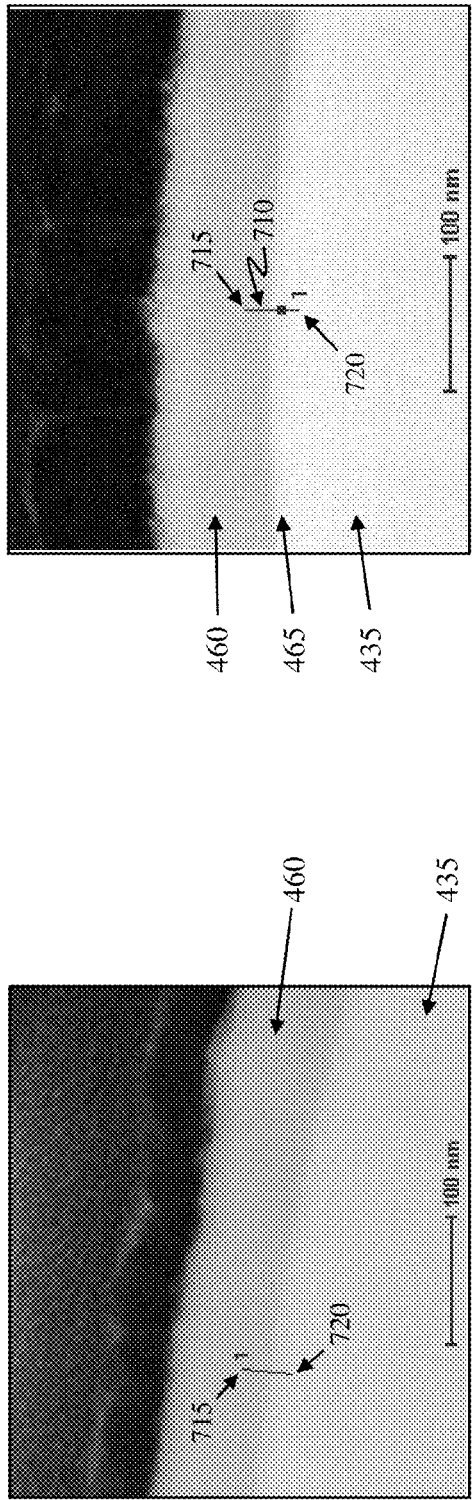
FIGS. 7A-7B and 8A-8B show an interface and atomic constituents at positions in the interface in accordance with aspects of the invention.
Figure 7B:
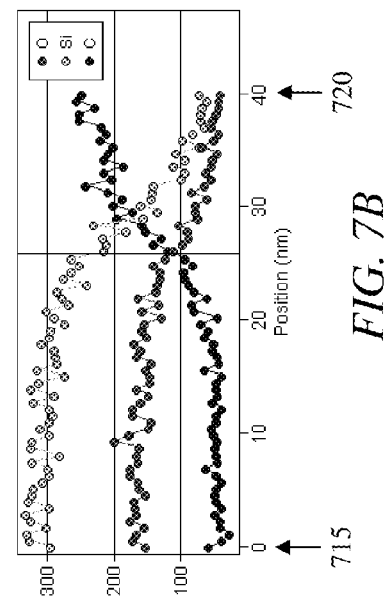

FIG. 7A shows a cross sectional view of an interface between the microlens elements 435 and the protective oxide layer 460 of a structure made in accordance with aspects of the invention, and FIG. 7B depicts a plot of atomic constituents at various depths along the interface of FIG. 7A. A reference line 710 is provided in FIG. 7A, and the top 715 of the line 710 corresponds to the left side of the graph in FIG. 7B while the bottom 720 of the line 710 corresponds to the right side of the graph in FIG. 7B. The structure in FIG. 7A was formed using a PECVD process as described above with flowing silane for about 2.5 second prior to applying RF power, which process formed an interfacial region 465 in accordance with aspects of the invention.

Figure 8A:
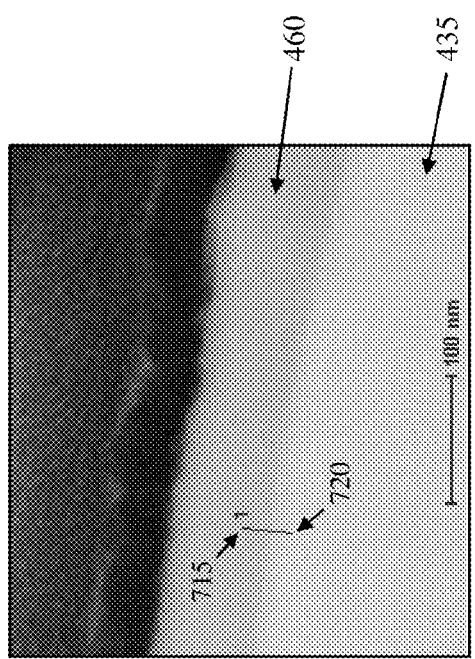
Figure 8B:
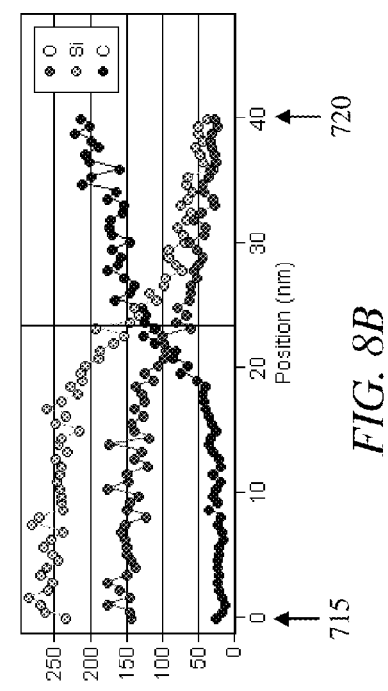

FIGS. 8A and 8B are associated with a structure formed in the same manner as that of FIGS. 7A and 7B, except that in the structure of FIGS. 8A and 8B the silane was only flowed for about 0.5 second prior to the application of RF power, which did not result in the formation of the interfacial region 465. As can be seen by comparing FIGS. 7A-B to FIGS. 8A-B, the process associated with FIGS. 7A-B has more silicon and oxygen at the oxide/microlens interface compared with the process associated with FIGS. 8A-B. Moreover, the process associated with FIGS. 7A-B has less change in the silicon:oxygen ratio at both the oxide/microlens interface and the oxide/air interface compared with the process associated with FIGS. 8A-B. It is notable that the surface roughness is substantially equivalent for both films.

Still referring to FIGS. 7A-B and 8A-B, the process associated with FIGS. 7A-B has less carbon at the oxide/microlens interface compared with the process associated with FIGS. 8A-B. Additionally, the process associated with FIGS. 8A-B has nearly equal parts of carbon and silicon at the oxide/microlens interface, whereas the process associated with FIGS. 7A-B has significantly more silicon than carbon at the oxide/microlens interface. The difference in silicon:carbon ratio is consistent with flowing the silane for a longer predetermined time in the process associated with FIGS. 7A-B, the net effect of flowing the silane for a longer predetermined time being that a more glass-like film is being formed at the beginning and end of the deposition process compared with the process associated with FIGS. 8A-B.

Figure 9:
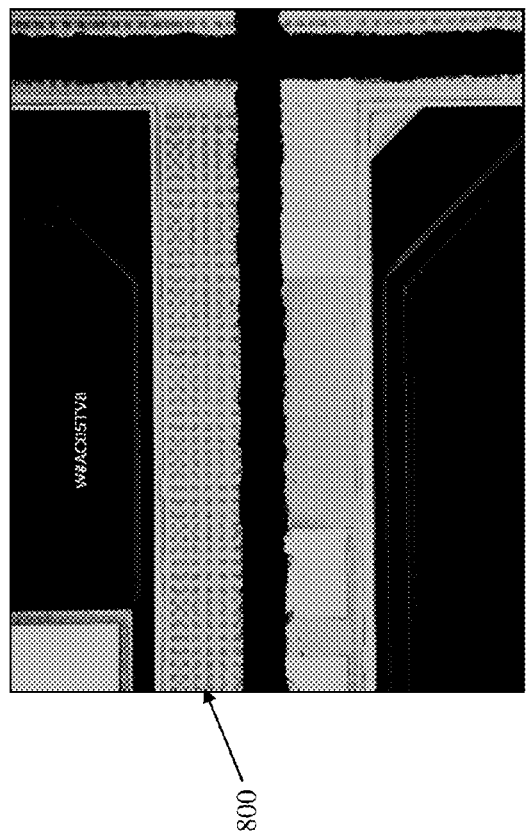
FIGS. 9 and 10 show plan views of chips manufactured in accordance with aspects of the invention.
Figure 10:
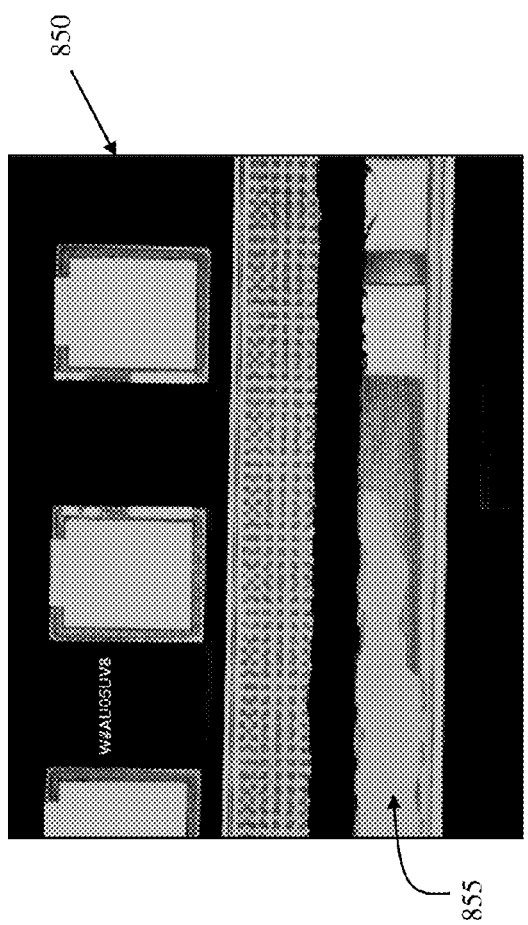

FIGS. 9 and 10 depict plan views of wafers made in accordance with processes associated with FIGS. 7A-B and 8A-B, respectively. The wafer 800 shown in FIG. 9, formed using a PECVD process in which silane was flowed for about 2.5 second prior to RF power application, does not exhibit any cracking or delamination. In contrast, the wafer 850 shown in FIG. 10, formed using a PECVD process in which silane was flowed for about 0.5 second prior to RF power application, shows delamination at area 855.

As described herein, implementations of the invention provide a method to improve the adhesion of an inorganic coating (e.g., silicon-oxide) to an organic material (e.g., photoresist) by utilizing a delay of at least two seconds between inorganic precursor and oxidizing gas introduction to a PECVD reactor. Implementations may further provide a method to improve the adhesion of an inorganic coating to an organic material by creating a silicon to carbon ratio at the interface of at least 6:1. Additional implementations of the invention provide a method to improve the adhesion of an inorganic coating to an organic material by utilizing a bi-layer inorganic coating in which a first layer of the bi-layer inorganic coating contains a lower concentration of oxygen than a second layer of the bi-layer inorganic coating.

Figure 11:
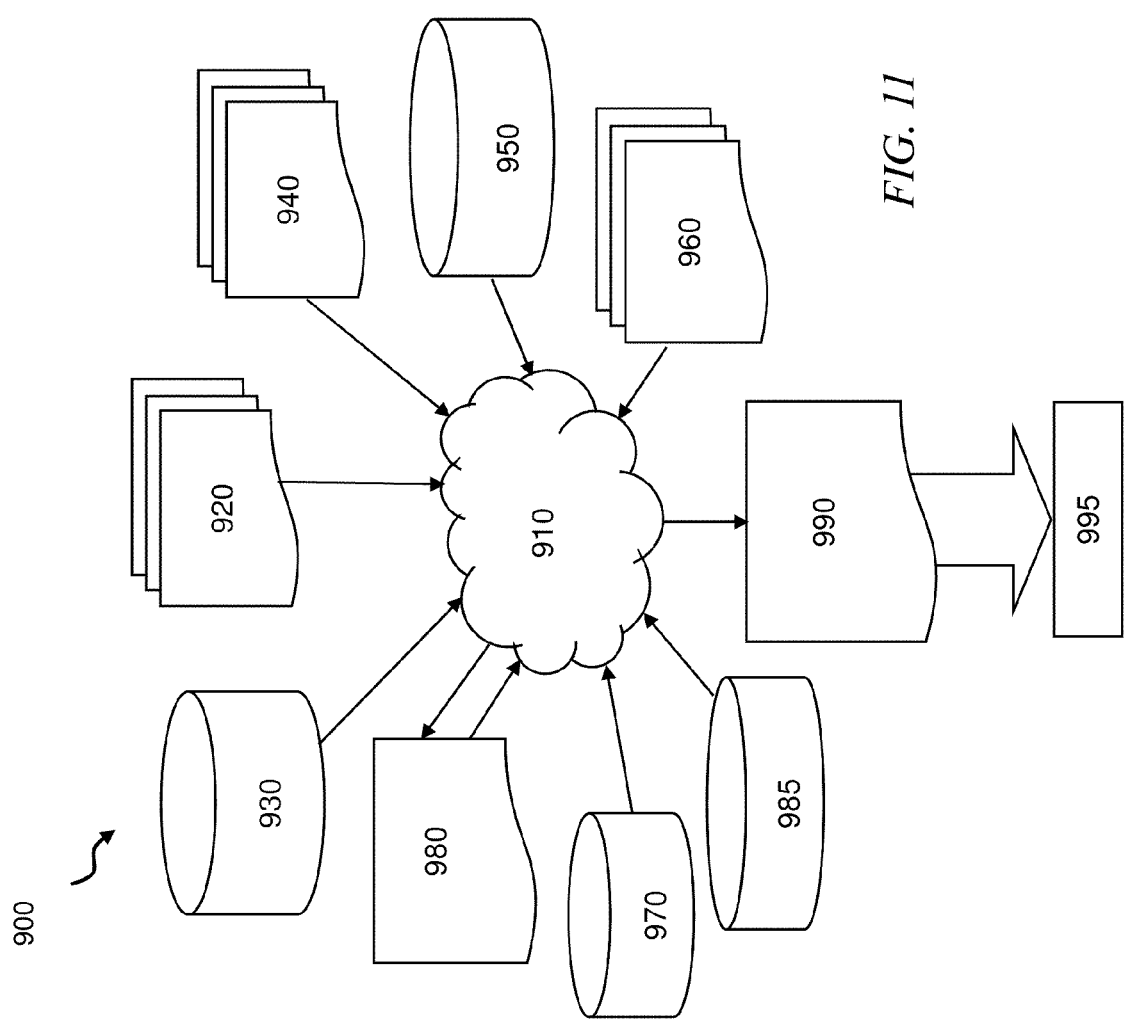
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 4. In one embodiment, design structure 990 may comprise a compiled, executable HDL simulation model that functionally simulates the devices shown in FIG. 4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of fabricating a semiconductor structure, comprising forming an interfacial region between a microlens and a protective oxide layer,
   wherein the interfacial region has a lower concentration of oxygen than the protective oxide layer; and
   wherein the forming of the interfacial region comprises flowing a precursor prior to applying power in a deposition process for forming the protective oxide layer.

2. The method of claim 1, further comprising forming the microlens comprising organic photoresist material.

3. The method of claim 1, wherein the interfacial region increases adhesion between the microlens and the protective oxide layer compared to an adhesion level of the microlens being in direct contact with the protective oxide layer.

4. The method of claim 1, wherein the interfacial region is formed during a deposition process of the protective oxide layer.

5. The method of claim 1, wherein:
   the interfacial region is composed of one of silicon, silicon nitride, silicon carbide, and silicon oxynitride; and
   the protective oxide is composed of silicon oxide.

6. The method of claim 1, further comprising forming the protective oxide layer using a plasma enhanced chemical vapor deposition (PECVD) process, wherein the forming the interfacial region occurs as part of the PECVD process.

7. The method of claim 1, wherein the precursor comprises an inorganic precursor.

8. The method of claim 7, wherein the deposition process comprises a chemical vapor deposition (CVD) process.

9. The method of claim 8, wherein the interfacial region is formed during the CVD process.

10. A method of fabricating a semiconductor structure, comprising forming an interfacial region between a microlens and a protective oxide layer,
wherein the interfacial region has a lower concentration of oxygen than the protective oxide layer;
the interfacial region is formed during a deposition process of the protective oxide layer;
the deposition process of the protective oxide layer comprises a chemical vapor deposition (CVD) process; and
the forming the interfacial region comprises creating a silicon-rich environment in a process chamber prior to applying power in the CVD process.

11. A method of fabricating a semiconductor structure, comprising forming an interfacial region between a microlens and a protective oxide layer,
wherein the interfacial region has a lower concentration of oxygen than the protective oxide layer;
the interfacial region is formed during a deposition process of the protective oxide layer;
the deposition process of the protective oxide layer comprises a chemical vapor deposition (CVD) process; and
the forming the interfacial region comprises flowing an inorganic precursor for a predetermined amount of time prior to applying power in the CVD process.

12. The method of claim 11, wherein:
the inorganic precursor comprises silane; and
the predetermined amount of time is in a range of about 2.0 seconds to about 5.0 seconds.

13. The method of claim 11, wherein:
the flowing the inorganic precursor for the predetermined amount of time affects a deposition rate of the protective oxide layer; and
the predetermined amount of time is selected such that the deposition rate is in a substantially constant region.

14. A method of fabricating a semiconductor structure, comprising forming an interfacial region between a microlens and a protective oxide layer,
wherein the interfacial region has a lower concentration of oxygen than the protective oxide layer; and
the forming the interfacial region comprises creating a silicon to carbon ratio of about 6:1 at an interface between the microlens and the protective oxide.

15. A method of fabricating a semiconductor structure, comprising forming an interfacial region between a microlens and a protective oxide layer,
wherein the interfacial region has a lower concentration of oxygen than the protective oxide layer;
further comprising forming the protective oxide layer using a plasma enhanced chemical vapor deposition (PECVD) process, wherein the forming the interfacial region occurs as part of the PECVD process;
wherein the PECVD process comprises:
placing a wafer comprising the microlens in a process chamber;
flowing an oxidizer in the process chamber; and
flowing an inorganic precursor in the process chamber for a predetermined amount of time prior to applying radio frequency (RF) power to initiate deposition.

16. The method of claim 15, wherein:
the oxidizer comprises nitrous oxide;
the inorganic precursor comprises silane; and
the predetermined amount of time is in a range of about 2.0 seconds to about 5.0 seconds.

17. A method of forming a semiconductor structure, comprising:
forming an organic layer on a substrate; and
forming an inorganic layer on the organic layer,
wherein the forming the inorganic layer comprises forming an interfacial region between the organic layer and the inorganic layer;
the interfacial region has a lower concentration of oxygen than the inorganic layer;
the interfacial region increases adhesion between the organic layer and the inorganic layer compared to an adhesion level of the organic layer being in direct contact with the inorganic layer; and
further comprising forming the inorganic layer using a deposition process, wherein the forming the interfacial region occurs as part of the deposition process,
wherein the deposition process comprises:
placing a wafer comprising the organic layer in a process chamber;
flowing an oxidizer in the process chamber; and
flowing an inorganic precursor in the process chamber for a predetermined amount of time prior to applying power to initiate deposition.

18. The method of claim 17, wherein:
the organic layer is composed of photoresist material;
the inorganic layer is composed of a low temperature oxide; and
the interfacial region is composed of one of silicon, silicon nitride, silicon carbide, and silicon oxynitride.

19. The method of claim 17, wherein:
the oxidizer comprises nitrous oxide;
the inorganic precursor comprises silane; and
the predetermined amount of time is in a range of about 2.0 seconds to about 5.0 seconds.

* * * * *